United States Patent
Choi et al.

(10) Patent No.: US 6,844,134 B2
(45) Date of Patent: Jan. 18, 2005

(54) PHOTOSENSEITIVE POLYMER HAVING FLUORINATED ETHYLENE GLYCOL GROUP AND CHEMICALLY AMPLIFIED RESIST COMPOSITION COMPRISING THE SAME

(75) Inventors: Sang-Jun Choi, Seoul (KR); Joo-Tae Moon, Kyungki-do (KR); Sang-Gyun Woo, Kyungki-do (KR); Kwang-Sub Yoon, Seoul (KR); Ki-Yong Song, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 125 days.

(21) Appl. No.: 10/289,108

(22) Filed: Nov. 5, 2002

(65) Prior Publication Data

US 2003/0125511 A1 Jul. 3, 2003

(30) Foreign Application Priority Data

Nov. 7, 2001 (KR) ........................................ 2001-69228

(51) Int. Cl.$^7$ ......................... G03F 7/004; C08F 214/18
(52) U.S. Cl. ................... 430/270.1; 430/910; 526/281; 526/242; 526/319
(58) Field of Search ................................ 526/242, 281, 526/319, 245, 246; 430/270.1, 905, 910, 907

(56) References Cited

U.S. PATENT DOCUMENTS

2003/0091794 A1 * 5/2003 Jing et al. .................... 428/144

FOREIGN PATENT DOCUMENTS

JP 2002287285 * 10/2002

OTHER PUBLICATIONS

Chemical Abstract DN 137:286340 for JP2002287285.*
Chemical Abstract DN 113:192011 for Sharakhmedov et al.*
Copy of Article entitled Polymer design for 157nm chemically amplified resists published in Proc. SPIE, vol. 4345, 273–284 (2001).

* cited by examiner

Primary Examiner—Rosemary Ashton
(74) Attorney, Agent, or Firm—Marger Johnson & McCollom, P.C.

(57) ABSTRACT

A photosensitive polymer comprises a fluorinated ethylene glycol group and a chemically amplified resist composition including the photosensitive polymer. The photosensitive polymer has a weight average molecular weight of about 3,000–50,000 having a repeating unit as follows:

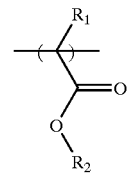

wherein $R_1$ is a hydrogen atom or methyl group, and $R_2$ is a fluorinated ethylene glycol group having 3 to 10 carbon atoms.

50 Claims, No Drawings

PHOTOSENSEITIVE POLYMER HAVING FLUORINATED ETHYLENE GLYCOL GROUP AND CHEMICALLY AMPLIFIED RESIST COMPOSITION COMPRISING THE SAME

This application claims priority from Korean Patent Application No. 2001-0069228, filed on Nov. 7, 2001, the contents of which are incorporated herein by reference in their entirety.

BACKGROUND OF THE INVENTION

1. Field of the Invention

The present invention relates to semiconductor fabrication and, more particularly, to a photosensitive polymer and a chemically amplified resist composition.

2. Description of the Related Art

As the manufacture of semiconductor devices becomes complicated and the integration density of semiconductor devices highly increases, there is a need to form a fine pattern. Furthermore, with regard to semiconductor devices having a memory capacity of 1-Gigabit or more, a pattern size having a design rule of 0.1 µm or less is needed.

When a conventional photoresist material is exposed with KrF excimer laser (248 nm), however, it is difficult to form such fine patterns. For this reason, a lithography technique using a new exposure light source, ArF excimer laser (193 nm) or $F_2$ (157 nm) excimer laser, has been actively researched. Specifically, for the lithography using a short-wavelength generating $F_2$ (157 nm) excimer laser, a resist material with a novel structure is required.

Polymer materials used in the lithography using $F_2$ (157 nm) excimer laser are required to meet the following requirements: (1) high transparency for 157 nm light source; (2) high resistance against a plasma used during a dry etching process; (3) good adhesion to the underlying layers to avoid pattern collapse; and (4) capability of being developed using a conventional developer.

There are several limitations in satisfying the above requirements. Particularly, polymer materials may have very low transparency and a very weak resistance against a dry etching process.

To date, several resist materials for next-generation $F_2$ excimer laser have been found and various researches into fluorinated polymers and siloxane polymers have been made. In particular, because fluorinated polymers have excellent transmittance at 157 nm, they are vigorously being studied as next-generation resist materials. These materials are, however, difficult to synthesize monomers. And polymers synthesized therefrom have too strong hydrophobicity. Thus, it is difficult to find suitable structures as resist materials.

As one of resist materials for 157 nm laser, a polynorbornene copolymer having the following formula was proposed as follows.

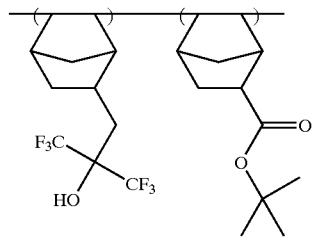

The copolymer having the above structural formula has good adhesion and dry etching resistance characteristics. The copolymer, however, also potentially suffers from drawbacks. Specifically, it is difficult to adjust the molecular weight in synthesizing polymers, and it is also difficult to remove impurities produced due to use of metallic catalyst.

Another conventional resist material is a copolymer of α-trifluoromethylacrylic monomer and a styrene derivative, as disclosed in Proc. SPIE, Vol. 4345, 273–284 (2001), the copolymer having a structural formula as follows.

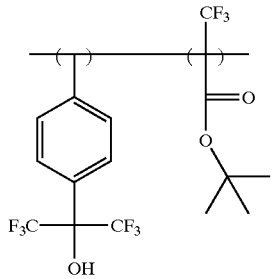

The above-referenced report suggested that a fluorinated aromatic compound having the above structure could be suitably as a thin-film resist material at 157 nm. However, this compound has still several drawbacks. In particular, there is a need for polymers having a high transmittance and improved dry etching resistance.

SUMMARY OF THE INVENTION

The present invention provides a photosensitive polymer having a high transmittance and improved dry etching resistance when used as a resist composition material.

The present invention also provides a resist composition having a high transmittance and good dry etching resistance, adhesiveness and wettability.

According to an aspect of the present invention, there is provided a photosensitive polymer comprising a repeating unit having a structural formula as follows:

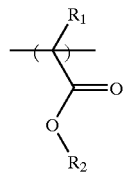

wherein $R_1$ is a hydrogen atom or methyl group, and $R_2$ is a fluorinated ethylene glycol group having 3 to 10 carbon atoms. Preferably, $R_2$ is a fluorinated diethylene glycol monomethyl ether group or a fluorinated triethylene glycol monomethyl ether group.

The photosensitive polymer according to an embodiment of the present invention may have a structural formula as follows:

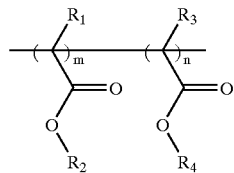

wherein $R_1$ and $R_2$ are defined as above, $R_3$ is a hydrogen atom, a methyl group or a trifluoromethyl group, $R_4$ is a hydrogen atom, a hydroxy group, an alkyl group, a fluorinated alkyl group, an alkoxy group, an aldehyde group, an ester group, a nitrile group or a sulfonic acid group, and $m/(m+n)=0.1–0.6$, and $n/(m+n)=0.4–0.9$. Preferably, $R_2$ is a fluorinated diethylene glycol monomethyl ether group or a fluorinated triethylene glycol monomethyl ether group. More preferably, $R_4$ is an acid-labile $C_4$–$C_{20}$ ester group or a fluorinated $C_3$–$C_{10}$ alcohol group.

Also, the photosensitive polymer according to another embodiment of the present invention may have a structural formula as follows:

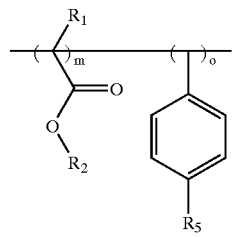

wherein $R_1$ and $R_2$ are defined as above, $R_5$ is a hydrogen atom, a hydroxy group, a substituted or unsubstituted $C_1$–$C_{10}$ hydrocarbon group or a fluorinated $C_1$–$C_{10}$ alkyl hydrocarbon group, and $m/(m+o)=0.1–0.6$, and $o/(m+o)=0.4–0.9$. In particular, $R_5$ is preferably an acid-labile $C_4$–$C_{10}$ protecting group, for example, t-butoxycarbonyloxy group. More preferably, $R_5$ is a 2-hydroxyhexafluoroisopropyl group, a 2-hydroxy-1,1,1-trifluoroisopropyl group or a 2-trifluoromethyl-1,1,1-trifluoro-2-hydroxypropyl group.

Alternatively, the photosensitive polymer according to the present invention may have a structural formula as follows:

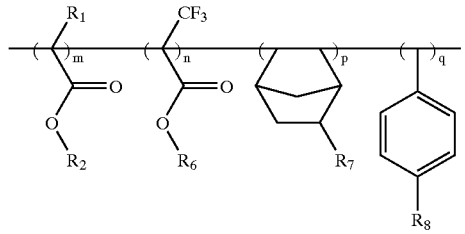

wherein $R_1$ and $R_2$ are defined as above, $R_6$ is a hydrogen atom or a substituted or unsubstituted $C_1$–$C_{20}$ hydrocarbon group, $R_7$ and $R_8$ are independently a hydrogen atom, a hydroxy group, a nitrile group, a substituted or unsubstituted $C_1$–$C_{10}$ hydrocarbon group, a fluorinated $C_1$–$C_{10}$ alkyl group, an alkoxy group or an ester group, and $m/(m+n+p+q)=0.01–0.4$, $n/(m+n+p+q)=0.1–0.5$, $p/(m+n+p+q)=0.0–0.4$, and $q/(m+n+p+q)=0.0–0.4$ with proviso that $p/(m+n+p+q)$ and $q/(m+n+p+q)$ are both not 0.0. Preferably, $R_2$ is a fluorinated diethylene glycol monomethyl ether group or a fluorinated triethylene glycol monomethyl ether group. In particular, $R_6$ is preferably an acid-labile $C_4$–$C_{10}$ protecting group, for example, t-butyl group. At least one of $R_7$ and $R_8$ may be an acid-labile $C_4$–$C_{10}$ ester group or a fluorinated $C_3$–$C_{10}$ alkyl alcohol group. More preferably, $R_6$ is an acid-labile group, and at least one of $R_7$ and $R_8$ may be a 2-hydroxyhexafluoroisopropyl group, a 2-hydroxy-1,1,1-trifluoroisopropyl group or a 2-trifluoromethyl-1,1,1-trifluoro-2-hydroxypropyl group.

In another aspect of the present invention, there is provided a resist composition comprising the photosensitive polymer, a photoacid generator (PAG) and an organic base.

The PAG is preferably contained in an amount of about 1–15% by weight based on the total weight of the photosensitive polymer. Preferably, the PAG comprises triarylsulfonium salts, diaryliodonium salts, or mixtures of these compounds. Examples of the PAG include triphenylsulfonium triflate, diphenyliodonium triflate, di-t-butylphenyliodonium triaflate, or mixtures of these compounds.

The organic base may be contained in an amount of about 0.01–2.0% by weight based on the total weight of the photosensitive polymer.

Although a photosensitive polymer according an aspect of to the present invention contains relatively more fluorine atoms so as to enhance transmittance of a resist film, it has a structure capable of overcoming the problem of hydrophobicity which may be caused by the fluorine atoms. Thus, a resist composition derived from the photosensitive polymer according to the present invention provides a high transmittance, good adhesion to the underlying layer and excellent dry etching resistance, and the resist composition allows development using conventional developers.

DETAILED DESCRIPTION OF THE INVENTION

SYNTHESIS EXAMPLE 1

Synthesis of Monomer

31 g (0.11 mol) of fluorinated diethylene glycol monomethyl ether and 13 g of triethylamine (TEA) were dissolved in a 500 mL-three-neck flask with 150 mL tetrahydrofuran (THF). 10 g (0.1 mol) of methacryloyl chloride in an ice-bath was slowly dropwise added to the resultant solution, followed by reacting at room temperature for about 12 hours.

After the reaction was completed, the resultant product was dropwise added into excess water and neutralized with HCl. Thereafter, diethyl ether was extracted and an organic layer was dried using $MgSO_4$, to separate a desired product by vacuum distillation with a yield of 70%

SYNTHESIS EXAMPLE 2
Synthesis of Monomer

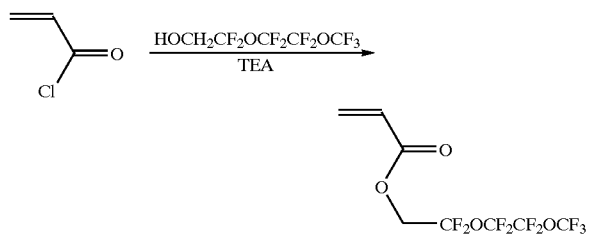

31 g (0.11 mol) of fluorinated diethylene glycol monomethyl ether and 13 g of triethylamine (TEA) were dissolved in a 500 mL-three-neck flask with 150 mL tetrahydrofuran (THF). 9 g (0.1 mol) of acryloyl chloride in an ice-bath was slowly dropwise added to the resultant solution, followed by reacting at room temperature for about 12 hours.

Thereafter, the same or similar procedure as in Synthesis Example 1 was carried out to give a desired product with a yield of 65%.

SYNTHESIS EXAMPLE 3
Synthesis of Monomer

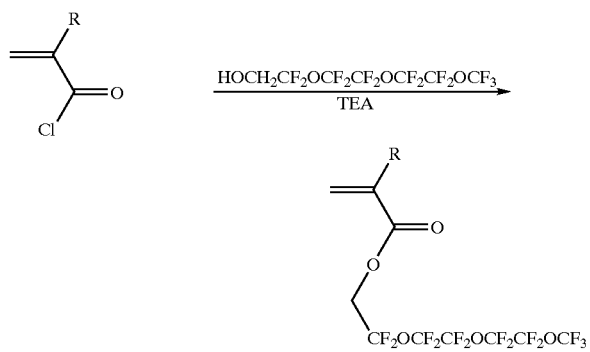

In the formula, R is a hydrogen atom or a methyl group. Fluorinated triethylene glycol monomethyl ether was reacted with acryloyl chloride (R=H) and methacryloyl chloride (R=methyl) in the presence of TEA to give desired products with a yield of 65%, respectively.

EXAMPLE 1
Synthesis of Copolymer

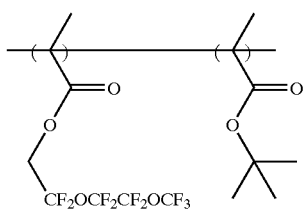

7 g (20 mmol) of the monomer synthesized in Synthesis Example 1, 2.8 g (20 mmol) of t-butyl methacrylate and 0.33 g (5 mol %) of AIBN (azobisisobutyronitrile) were dissolved in 20 g THF. Thereafter, the resultant reaction product was completely purged using a nitrogen gas and polymerized at approximately 65° C. for about 8 hours.

After polymerization, the reaction product was slowly precipitated twice in excess n-hexane and filtered. The filtrate was dried in a vacuum oven maintained at 50° C. for 24 hours to give a desired polymer with a yield of 75%.

The resultant polymer had a weight average molecular weight (Mw) of 18,800 and a polydispersity (Mw/Mn) of 2.0.

EXAMPLE 2
Synthesis of Copolymer

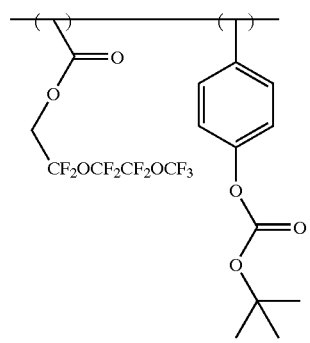

The same procedure as in Example 1 was carried out except that 20 mmol of the monomer synthesized in Synthesis Example 2, 20 mmol of t-buthoxy carbonyloxy styrene and 5 mol % of AIBN were dissolved in excess THF (3 folds the total weight of the monomer), thereby obtaining a desired polymer with a yield of 60%.

The resultant polymer had a weight average molecular weight (Mw) of 11,300 and a polydispersity (Mw/Mn) of 1.9.

EXAMPLE 3
Synthesis of Terpolymer

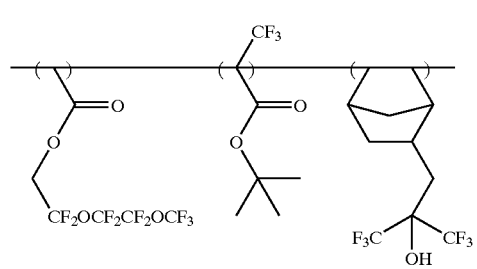

10 mmol of the monomer prepared in Synthesis Example 2, 10 mmol of t-butyl α-trifluoromethylacrylate, 10 mmol of 5-(2-trifluoromethyl-1,1,1-trifluoro-2-hydroxypropyl)-2-norbornene, and 5 mol % of AIBN were dissolved in a round-bottom flask with THF (2 folds the total weight of the monomer). Thereafter, the resultant product was completely purged using nitrogen gas, and polymerized at approximately 65° C. for 24 hours.

After polymerization, the reaction product was slowly precipitated in excess n-hexane. Then, the precipitate was filtered and the filtrate was dissolved once more in an appropriate amount of THF to then be reprecipitated in n-hexane. Then, the filtrate was dried in a vacuum oven maintained at 50° C. for 24 hours to give a desired polymer with a yield of 60%.

The resultant polymer had a weight average molecular weight (Mw) of 8,900 and a polydispersity (Mw/Mn) of 2.0.

EXAMPLE 4

Synthesis of Terpolymer

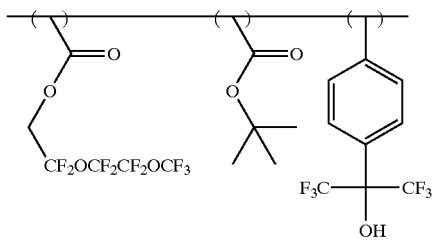

The same procedure as in Example 3 was carried out except that 5 mmol of the monomer synthesized in Synthesis Example 2, 10 mmol of t-butyl acrylate monomer, 10 mmol of 4-(2-hydroxyhexafluoroisopropyl) styrene and 5 mol % of AIBN were dissolved in excess THF (3 folds the total weight of the monomer), thereby obtaining a desired polymer with a yield of 65%.

The resultant polymer had a weight average molecular weight (Mw) of 12,800 and a polydispersity (Mw/Mn) of 2.1.

EXAMPLE 5

Synthesis of Terpolymer

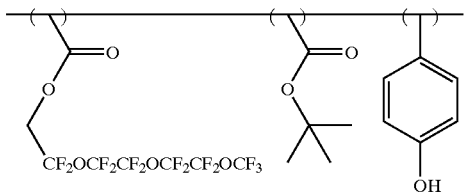

The same procedure as in Example 3 was carried out except that 10 mmol of the monomer synthesized in Synthesis Example 3, 10 mmol of t-butyl acrylate monomer, 10 mmol of 4-hydroxy styrene and 5 mol % of AIBN were dissolved in excess THF (3 folds the total weight of the monomer), thereby obtaining a desired polymer with a yield of 70%.

The resultant polymer had a weight average molecular weight (Mw) of 11,500 and a polydispersity (Mw/Mn) of 1.9.

EXAMPLE 6

Synthesis of Terpolymer

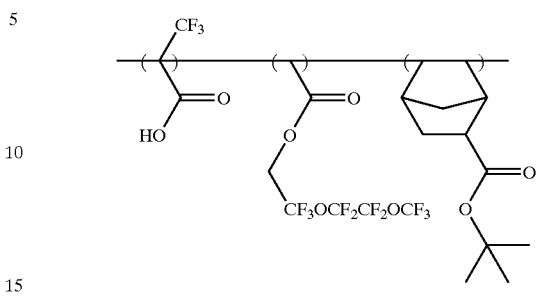

The same procedure as in Example 3 was carried out except that 10 mmol of the monomer synthesized in Synthesis Example 2, 10 mmol of α-trifluoromethylacrylic acid, 20 mmol of 5-t-butyl-2-norbornene carboxylate and 5 mol % of AIBN were dissolved in excess THF (2 folds the total weight of the monomer), thereby obtaining a desired polymer with a yield of 60%.

The resultant polymer had a weight average molecular weight (Mw) of 8,800 and a polydispersity (Mw/Mn) of 2.2.

EXAMPLE 7

Synthesis of Tetrapolymer

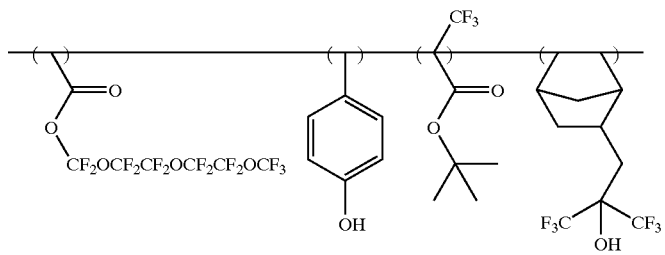

The same procedure as in Example 3 was carried out except that 10 mmol of the monomer synthesized in Synthesis Example 3, 10 mmol of 4-hydroxy styrene monomer, 10 mmol of 5-(2-trifluoromethyl-1,1,1-trifluoro-2-hydroxypropyl)-2-norbornene, 30 mmol of t-butyl α-trifluoromethylacrylate and 5 mol % of AIBN were dissolved in excess THF (2 folds the total weight of the monomer), thereby obtaining a desired polymer with a yield of 50%.

The resultant polymer had a weight average molecular weight (Mw) of 9,500 and a polydispersity (Mw/Mn) of 2.1.

EXAMPLE 8

Preparation of Resist Composition and Patterning Process 1.0 g of each of the polymers synthesized in Examples 1 through 7 was dissolved in 8 g propylene glycol methyl ether acetate (PGMEA) together with 0.02 g triphenylsulfonium triflate as a photoacid generator (PAG). 2 mg triisobutylamine was added to the reaction product as an organic base and completely dissolved, thereby preparing resist compositions.

Each of the resist compositions was coated to a thickness of about 0.33 μm on a bare silicon wafer treated with hexamethyldisilazane (HMDS).

Each of the wafers was pre-baked at a temperature of about 120–140° C. for about 60–90 seconds and exposed using an ArF excimer laser stepper (NA=0.6, σ=0.75).

Thereafter, the wafer was subjected to post-exposure bake (PEB) at a temperature of about 110–140° C. for about 60–90 seconds. The resultant wafer was developed with a 2.38% by weight tetramethylammonium hydroxide (TMAH) solution. As a result, a clean pattern of lines and spaces of 180 nm was obtained at an exposure dose of about 5–20 mJ/cm$^2$.

In preparing the resist composition according to the present invention, the PAG is contained in an amount of 1–15 wt % based on the weight of the photosensitive polymer, and may be triarylsulfonium salts, diaryliodonium salts or mixtures thereof. Also, the organic base is contained in an amount of 0.01–2.0 wt %, and may be an organic ternary amine exemplified by triethylamine, triisobutylamine, triisooctylamine, triisodecylamine, diethanolamine, triethanolamine, or a mixture of these compounds.

In forming the pattern, the thickness of the resist composition coated on each wafer may vary depending on the applications, although typically the thickness is about 0.1~0.5 μm. Also, during pre-baking, the baking temperature may differ according to the kind of a protecting group used, generally in the temperature range of about 110–140° C. for approximately 60~90 seconds. During exposure, the dose may be different depending on the light source of deep-UV used. In the case of ArF or F$_2$ excimer laser, the energy used is generally in the range of 5~50 mJ/cm$^2$. Also, during PEB, the baking temperature may differ according to the kind of protecting group used, generally in the temperature range of about 110~140° C. for approximately 60~90 seconds. During development, 2.38 wt % TMAH (0.26N) solution is generally used, and the development is performed for approximately 20~60 seconds.

The photosensitive polymer includes repeating units comprised of acrylate or methacrylate monomers having a fluorinated ethylene glycol group. Although the photosensitive polymer having such a structure according to an embodiment of the present invention contains relatively more fluorine atoms so as to enhance transmittance of a resist film, it has oxygen atoms to enhance hydrophillic properties so as to overcome the problem of hydrophobicity which may be caused by the fluorine atoms. Thus, a resist composition derived from the photosensitive polymer according to the present invention provides a high transmittance, good adhesion to an underlying layer and excellent dry etching resistance, and the resist composition allows development using conventional developers. Therefore, use of the resist composition according to the present invention allows formation of finer patterns. Also, when applied to a photolithography process using F$_2$ (157 nm) excimer laser as a light source, the photosensitive polymer constituting the resist composition according to the present invention can exhibit desirable lithographic performance, so that it can be used in manufacturing next-generation semiconductor devices.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A photosensitive polymer having a repeating unit which comprises:

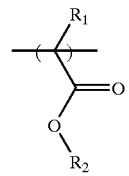

wherein $R_1$ is a hydrogen atom or methyl group, and $R_2$ is a hydrocarbon group having a fluorinated ethylene glycol group having 3 to 10 carbon atoms, wherein $R_2$ is a fluorinated diethylene glycol monomethyl ether group or a fluorinated triethylene glycol monomethyl ether group.

2. The photosensitive polymer according to claim 1, wherein the polymer has a weight average molecular weight of about 3,000–50,000.

3. The photosensitive polymer according to claim 1, further comprising at least one additional repeating unit linked to the repeating unit which is selected from the group consisting of acrylate derivatives, methacrylate derivatives, norbornene derivatives, maleic anhydride monomer, alkyl vinyl ether, vinyl acetate, acrolein, methacrolein, acrylonitrile and methacrylonitrile.

4. A photosensitive polymer having a structural formula comprising:

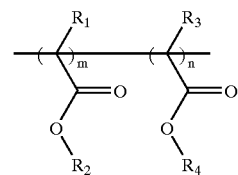

wherein $R_1$ is a hydrogen atom or methyl group, and $R_2$ is a hydrocarbon group having a fluorinated ethylene glycol group having 3 to 10 carbon atoms, and wherein $R_3$ is a hydrogen atom, a methyl group or a trifluoromethyl group, $R_4$ is a hydrogen atom, a hydroxy group, an alkyl group, a fluorinated alkyl group, an alkoxy group, an aldehyde group, an ester group, a nitrile group or a sulfonic acid group, and m/(m+n)=0.1–0.6, and n/(m+n)=0.4–0.9, wherein $R_2$ is a fluorinated diethylene glycol monomethyl ether group or a fluorinated triethylene glycol monomethyl ether group.

5. The photosensitive polymer according to claim 4, wherein $R_4$ is an acid-labile ester group having 4 to 20 carbon atoms.

6. The photosensitive polymer according to claim 4, wherein $R_4$ is a fluorinated alcohol group having 3 to 10 carbon atoms.

7. The photosensitive polymer according to claim 4, wherein the polymer has a weight average molecular weight of about 3,000–50,000.

8. A photosensitive polymer having a structural formula comprising:

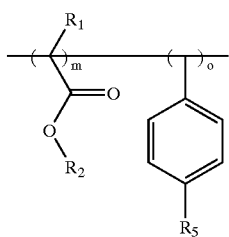

wherein $R_1$ is a hydrogen atom or methyl group, and $R_2$ is a hydrocarbon group having a fluorinated ethylene glycol group having 3 to 10 carbon atoms, and wherein $R_5$ is a hydrogen atom, a hydroxy group, a substituted or unsubstituted hydrocarbon group having 1 to 10 carbon atoms or a fluorinated alkyl hydrocarbon group having 1 to 10 carbon atoms, and $m/(m+o)=0.1–0.6$, and $o/(m+o)=0.4–0.9$.

9. The photosensitive polymer according to claim 8, wherein $R_2$ is a fluorinated diethylene glycol monomethyl ether group or a fluorinated triethylene glycol monomethyl ether group.

10. The photosensitive polymer according to claim 8, wherein $R_5$ is an acid-labile protecting group having 4 to 10 carbon atoms.

11. The photosensitive polymer according to claim 10, wherein $R_5$ is t-butoxycarbonyloxy group.

12. The photosensitive polymer according to claim 8, wherein $R_5$ is a 2-hydroxyhexafluoroisopropyl group, a 2-hydroxy-1,1,1-trifluoroisopropyl group or a 2-trifluoromethyl-1,1,1-trifluoro-2-hydroxypropyl group.

13. The photosensitive polymer according to claim 8, wherein the polymer has a weight average molecular weight of about 3,000–50,000.

14. A photosensitive polymer having a structural formula comprising:

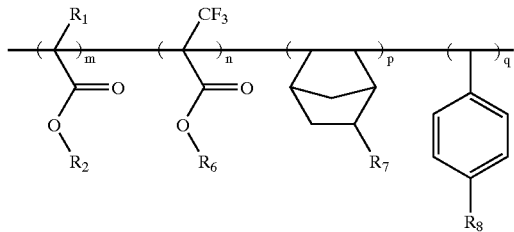

wherein $R_1$ is a hydrogen atom or methyl group, and $R_2$ is a hydrocarbon group having a fluorinated ethylene glycol group having 3 to 10 carbon atoms, and wherein $R_6$ is a hydrogen atom or a substituted or unsubstituted hydrocarbon group having 1 to 20 carbon atoms, $R_7$ and $R_8$ are independently a hydrogen atom, a hydroxy group, a nitrile group, a substituted or unsubstituted hydrocarbon group having 1 to 10 carbon atoms, a fluorinated alkyl group having 1 to 10 carbon atoms, an alkoxy group or an ester group, and $m/(m+n+p+q)=0.01–0.4$, $n/(m+n+p+q)=0.1–0.5$, $p/(m+n+p+q)=0.0–0.4$, and $q/(m+n+p+q)=0.0–0.4$, and $p/(m+n+p+q)$ and $q/(m+n+p+q)$ are both not 0.0.

15. The photosensitive polymer according to claim 14, wherein $R_2$ is a fluorinated diethylene glycol monomethyl ether group or a fluorinated triethylene glycol monomethyl ether group.

16. The photosensitive polymer according to claim 14, wherein $R_6$ is an acid-labile protecting group having 4 to 10 carbon atoms.

17. The photosensitive polymer according to claim 16, wherein $R_6$ is t-butyl group.

18. The photosensitive polymer according to claim 14, wherein at least one of $R_7$ and $R_8$ is an acid-labile ester group having 4 to 10 carbon atoms.

19. The photosensitive polymer according to claim 14, wherein at least one of $R_7$ and $R_8$ is a fluorinated alkyl alcohol group having 3 to 10 carbon atoms.

20. The photosensitive polymer according to claim 14, wherein $R_6$ is an acid-labile group, and at least one of $R_7$ and $R_8$ is a 2-hydroxyhexafluoroisopropyl group, a 2-hydroxy-1,1,1-trifluoroisopropyl group or a 2-trifluoromethyl-1,1,1-trifluoro-2-hydroxypropyl group.

21. The photosensitive polymer according to claim 14, wherein the polymer has a weight average molecular weight of about 3,000–50,000.

22. A resist composition comprising:
(a) a photosensitive polymer having a repeating unit which comprises:

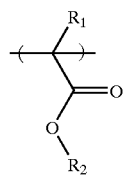

wherein $R_1$ is a hydrogen atom or methyl group, and $R_2$ is a fluorinated ethylene glycol group having 3 to 10 carbon atoms;
(b) a photoacid generator (PAG); and
(c) an organic base.

23. The resist composition according to claim 22, wherein $R_2$ is a fluorinated diethylene glycol monomethyl ether group or a fluorinated triethylene glycol monomethyl ether group.

24. The photosensitive polymer according to claim 22, wherein the polymer has a weight average molecular weight of about 3,000–50,000.

25. The resist composition according to claim 22, wherein the polymer further comprises at least one additional repeating unit which is linked to the repeating unit which is selected from the group consisting of acrylate derivatives, methacrylate derivatives, norbornene derivatives, maleic anhydride monomer, alkyl vinyl ether, vinyl acetate, acrolein, methacrolein, acrylonitrile and methacrylonitrile.

26. The resist composition according to claim 22, wherein the PAG is contained in an amount of about 1–15% by weight based on the total weight of the photosensitive polymer.

27. The resist composition according to claim 22, wherein the PAG comprises triarylsulfonium salts, diaryliodonium salts, or mixtures thereof.

28. The resist composition according to claim 27, wherein the PAG includes triphenylsulfonium triflate, diphenyliodonium triflate, di-t-butylphenyliodonium triaflate, or mixtures thereof.

29. The resist composition according to claim 22, wherein the organic base is contained in an amount of about 0.01–2.0% by weight based on the total weight of the photosensitive polymer.

30. The resist composition according to claim 22, wherein the organic base comprises tertiary amine compounds.

31. The resist composition according to claim 22, wherein the organic base is triethylamine, triisobutylamine, triisooctylamine, diethanolamine, triethanolamine, or mixtures thereof.

32. A resist composition comprising:
(a) a photosensitive polymer having a structural formula:

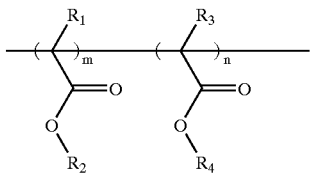

wherein $R_1$ is a hydrogen atom or methyl group, and $R_2$ is a fluorinated ethylene glycol group having 3 to 10 carbon atoms, and wherein $R_3$ is a hydrogen atom, a methyl group or a trifluoromethyl group, $R_4$ is a hydrogen atom, a hydroxy group, an alkyl group, a fluorinated alkyl group, an alkoxy group, an aldehyde group, an ester group, a nitrile group or a sulfonic acid group, and $m/(m+n)=0.1–0.6$, and $n/(m+n)=0.4–0.9$, (b) a photoacid generator (PAG); and
(c) an organic base.

33. The resist composition according to claim 32, wherein $R_2$ is a fluorinated diethylene glycol monomethyl ether group or a fluorinated triethylene glycol monomethyl ether group.

34. The resist composition according to claim 32, wherein $R_4$ is an acid-labile ester group having 4 to 20 carbon atoms.

35. The resist composition according to claim 32, wherein $R_4$ is a fluorinated alcohol group having 3 to 10 carbon atoms.

36. The photosensitive polymer according to claim 32, wherein the polymer has a weight average molecular weight of about 3,000–50,000.

37. A resist composition comprising:
(a) a photosensitive polymer baying a structural formula comprising;

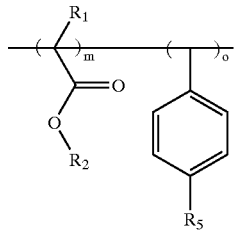

wherein $R_1$ is a hydrogen atom or methyl group, and $R_2$ is a fluorinated ethylene glycol group having 3 to 10 carbon atoms, and wherein $R_5$ is a hydrogen atom, a hydroxy group, a substituted or unsubstituted hydrocarbon group having 1 to 10 carbon atoms or a fluorinated alkyl hydrocarbon group having 1 to 10 carbon atoms, and $m/(m+o)=0.1–0.6$, and $o/(m+o)0.4–0.9$, (b) a photoacid generator (PAG); and
(c) an organic base.

38. The resist composition according to claim 37, wherein $R_2$ is a fluorinated diethylene glycol monomethyl ether group or a fluorinated triethylene glycol monomethyl ether group.

39. The resist composition according to claim 37, wherein $R_5$ is an acid-labile protecting group having 4 to 10 carbon atoms.

40. The resist composition according to claim 39, wherein $R_5$ is t-butoxycarbonyloxy group.

41. The resist composition according to claim 37, wherein $R_5$ is a 2-hydroxyhexafluoroisopropyl group, a 2-hydroxy-1,1-trifluoroisopropyl group or a 2-trifluoromethyl-1,1,1-trifluoro-2-hydroxypropyl group.

42. The photosensitive polymer according to claim 37, wherein the polymer has a weight average molecular weight of about 3,000–50,000.

43. A resist composition comprising:
(a) a photosensitive polymer having a structural formula comprising:

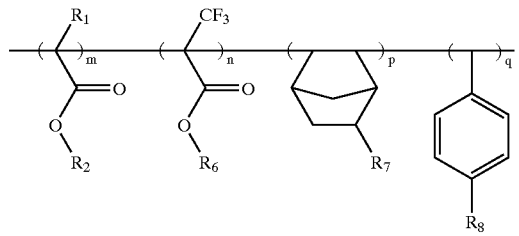

wherein $R_1$ is a hydrogen atom or methyl group, and $R_2$ is a fluorinated ethylene glycol group having 3 to 10 carbon atoms, and wherein $R_6$ is a hydrogen atom or a substituted or unsubstituted hydrocarbon group having 1 to 20 carbon atoms, $R_7$ and $R_8$ are independently a hydrogen atom, a hydroxy group, a nitrile group, a substituted or unsubstituted hydrocarbon group having 1 to 10 carbon atoms, a fluorinated $C_1$–$C_{10}$ alkyl group, an alkoxy group or an ester group, and $m/(m+n+p+q)=0.01–0.4$, $n/(m+n+p+q)=0.1–0.5$, $p/(m+n+p+q)=0.0–0.4$, and $q/(m+n+p+q)=0.0–0.4$ with the proviso that $p/(m+n+p+q)$ and $q/(m+n+p+q)$ are both not 0.0, (b) a photoacid generator (PAG); and
(c) an organic bases.

44. The resist composition according to claim 43, wherein $R_2$ is a fluorinated diethylene glycol monomethyl ether group or a fluorinated triethylene glycol monomethyl ether group.

45. The resist composition according to claim 43, wherein $R_6$ is an acid-labile protecting group having 4 to 10 carbon atoms.

46. The resist composition according to claim 45, wherein $R_6$ is a t-butyl group.

47. The resist composition according to claim 43, wherein at least one of $R_7$ and $R_8$ is an acid-labile ester group having 4 to 10 carbon atoms.

48. The resist composition according to claim 43, wherein at least one of $R_7$ and $R_8$ is a fluorinated alkyl alcohol group having 3 to 10 carbon atoms.

49. The resist composition according to claim 43, wherein $R_6$ is an acid-labile group, and at least one of $R_7$ and $R_8$ is a 2-hydroxyhexafluoroisopropyl group, a 2-hydroxy-1,1,1-trifluoroisopropyl group or a 2-trifluoromethyl-1,1,1-trifluoro-2-hydroxypropyl group.

50. The photosensitive polymer according to claim 43, wherein the polymer has a weight average molecular weight of about 3,000–50,000.

* * * * *

UNITED STATES PATENT AND TRADEMARK OFFICE
CERTIFICATE OF CORRECTION

PATENT NO.     : 6,844,134 B2
DATED          : January 18, 2005
INVENTOR(S)    : Choi et al.

It is certified that error appears in the above-identified patent and that said Letters Patent is hereby corrected as shown below:

Title page,
Item [54], Title, replace "PHOTOSENSEITIVE" with -- PHOTOSENSITIVE --.

Column 13,
Line 37, replace "polymer baying a" with -- polymer having a --.

Column 14,
Lines 4 and 5, replace "2-hydroxy-1, 1-trifluoroisopropyl" with -- 2-hydroxy-1,1,1-trifluoroisopropyl --.
Line 14, replace "an organic bases." with -- an organic base. --.

Signed and Sealed this

Fourteenth Day of February, 2006

JON W. DUDAS
*Director of the United States Patent and Trademark Office*

UNITED STATES PATENT AND TRADEMARK OFFICE
CERTIFICATE OF CORRECTION

PATENT NO. : 6,844,134 B2
DATED : January 18, 2005
INVENTOR(S) : Choi et al.

It is certified that error appears in the above-identified patent and that said Letters Patent is hereby corrected as shown below:

<u>Column 4,</u>
Line 2, replace "with proviso" with -- with the proviso --.

Signed and Sealed this

Twenty-fifth Day of April, 2006

JON W. DUDAS
*Director of the United States Patent and Trademark Office*